(12) United States Patent
Xie

(10) Patent No.: US 11,328,961 B2
(45) Date of Patent: May 10, 2022

(54) METHOD OF MANUFACTURING INVERTER AND INVERTER

(71) Applicant: SHENZHEN CHINA STAR OPTOELECTRONICS SEMICONDUCTOR DISPLAY TECHNOLOGY CO., LTD., Shenzhen (CN)

(72) Inventor: Huafei Xie, Shenzhen (CN)

( * ) Notice: Subject to any disclaimer, the term of this patent is extended or adjusted under 35 U.S.C. 154(b) by 292 days.

(21) Appl. No.: 16/626,352

(22) PCT Filed: Nov. 21, 2019

(86) PCT No.: PCT/CN2019/120003
§ 371 (c)(1),
(2) Date: Dec. 24, 2019

(87) PCT Pub. No.: WO2021/056785
PCT Pub. Date: Apr. 1, 2021

(65) Prior Publication Data
US 2021/0366781 A1    Nov. 25, 2021

(30) Foreign Application Priority Data

Sep. 23, 2019  (CN) .......................... 201910900644.9

(51) Int. Cl.
*H01L 29/76* (2006.01)
*H01L 29/94* (2006.01)
(Continued)

(52) U.S. Cl.
CPC .............. *H01L 21/823807* (2013.01); *H01L 21/823878* (2013.01); *H01L 29/0653* (2013.01)

(58) Field of Classification Search
CPC ..... H01L 21/823807; H01L 21/823878; H01L 29/0653; H01L 29/78684; H01L 21/823412; H01L 27/092
(Continued)

(56) References Cited

U.S. PATENT DOCUMENTS

2011/0168998 A1* 7/2011 Liang ................ H01L 29/78696
257/E29.264
2011/0256684 A1* 10/2011 Iwasaki ............ H01L 29/78621
257/E21.409

* cited by examiner

*Primary Examiner* — Theresa T Doan

(57) ABSTRACT

A method of manufacturing an inverter and an inverter are provided. The method of manufacturing the inverter includes following steps: forming a substrate and forming a first insulating layer on the substrate; forming a semiconductor-type carbon nanotube film on the first insulating layer; patterning the semiconductor-type carbon nanotube film to form a first active layer and a second active layer arranged at an interval; forming a first barrier layer on the first active layer and forming a second barrier layer on the second active layer, wherein the first barrier layer is an electrophilic film layer, and the second barrier layer is an electron donor film layer; and forming a first source and a first drain which are in contact with and spaced apart from two ends of the first active layer and forming a second source and a second drain which are in contact with and spaced with two ends of the second active layer, wherein the first drain is connected to the second source. By using the semiconductor-type carbon nanotube as the active layer to cooperate with the electrophilic film layer and the electron donor film layer as a barrier layer, manufacturing process of the inverter can be simplified, and manufacturing cost of the inverter can be reduced.

6 Claims, 6 Drawing Sheets

(51) Int. Cl.
　　　*H01L 31/062*　　　(2012.01)
　　　*H01L 21/8238*　　(2006.01)
　　　*H01L 29/06*　　　(2006.01)
(58) Field of Classification Search
　　　USPC .......................................................... 257/369
　　　See application file for complete search history.

METHOD OF MANUFACTURING INVERTER AND INVERTER

FIELD OF INVENTION

The present disclosure relates to the field of display technologies, and more particularly to a method of manufacturing an inverter and an inverter.

BACKGROUND OF INVENTION

With the development of display technology, flat display devices including liquid crystal display (LCD) devices and organic light emitting diode display (OLED) devices have become the most common display devices and are widely used in mobile phones, televisions, personal digital assistants, digital cameras, laptops, desktop computers and other consumer electronics products.

Whether it is a liquid crystal display device or an organic light emitting diode display device, complementary metal oxide semiconductor (CMOS) inverter is an important device in these devices. The inverter's main function is to receive an input signal and output an output signal that is logically opposite to the input signal.

Generally, a CMOS inverter needs to have bipolar characteristics, that is, it needs to include an N-type thin film transistor and a P-type thin film transistor. At present, most CMOS inverters use the same semiconductor material to achieve bipolar characteristics. For example, for a semiconductor material, different types of carrier transport may be caused due to a difference in work function of a metal material as a source/drain electrode. An asymmetric electrode is used to make a semiconductor material obtain bipolar characteristics to construct a CMOS inverter. Different modifications to the same electrode material can also adjust carrier transport properties to achieve equilibrium to make a CMOS inverter. However, whether different electrode materials are used, or different modifications are made to the same electrode material, it is necessary to accurately integrate different electrode materials or perform specific modification on the electrode materials at a specific position, the process is complicated, and the cost is high.

Compared with traditional thin film transistor (TFT) technology, carbon nanotube (CNT) thin film transistor has obvious advantages in device performance and manufacturing process, and process temperature and process complexity are lower. More importantly, the carbon nanotube film can be prepared using a carbon nanotube solution, which can realize large-scale and low-cost manufacturing by using a printing process. Therefore, carbon nanotube thin film transistors have great application prospects in future display drive backplanes, flexible electronics, and biodetectors.

SUMMARY OF INVENTION

An object of the present invention is to provide a method of manufacturing an inverter, which can simplify manufacturing process of the inverter and reduce manufacturing cost of the inverter.

An object of the present invention is also to provide an inverter, which can simplify manufacturing process of the inverter and reduce manufacturing cost of the inverter.

To achieve the above object, an embodiment of the present invention provides a method of manufacturing an inverter, comprising following steps: a step S1, forming a substrate and forming a first insulating layer on the substrate; a step S2, forming a semiconductor-type carbon nanotube film on the first insulating layer; a step S3, patterning the semiconductor-type carbon nanotube film to form a first active layer and a second active layer arranged at an interval; a step S4, forming a first barrier layer on the first active layer and forming a second barrier layer on the second active layer, wherein the first barrier layer is an electrophilic film layer, and the second barrier layer is an electron donor film layer; and a step S5, forming a first source and a first drain which are in contact with and spaced apart from two ends of the first active layer and forming a second source and a second drain which are in contact with and spaced with two ends of the second active layer, wherein the first drain is connected to the second source.

In an embodiment of the present invention, a step of forming the substrate in the step S1 comprises forming a heavily doped silicon wafer as the substrate.

In an embodiment of the present invention, a step of forming the substrate in the step S1 comprises providing a flexible substrate, covering the flexible substrate with a buffer layer, and forming a first gate and a second gate arranged at an interval on the buffer layer to obtain the substrate; wherein the first active layer and the second active layer are respectively disposed corresponding to the first gate and the second gate.

In an embodiment of the present invention, a step of forming the substrate in the step S1 comprises providing a glass substrate and forming a first gate and a second gate arranged at an interval on the glass substrate to obtain the substrate; wherein the first active layer and the second active layer are respectively disposed corresponding to the first gate and the second gate.

In an embodiment of the present invention, the semiconductor-type carbon nanotube film is formed by a solution printing process in the step S2, material of the first barrier layer comprises silicon nitride, and material of the second barrier layer comprises silicon oxide.

An embodiment of the present invention further provides an inverter, comprising: a substrate, a first insulating layer disposed on the substrate, a first active layer and a second active layer spaced apart from each other on the first insulating layer, a first barrier layer disposed on the first active layer, a second barrier layer disposed on the second active layer, a first source and a first drain which are in contact with and spaced from two ends of the first active layer, and a second source and a second drain which are in contact with and spaced from two ends of the second active layer, wherein the first drain is connected to the second source; wherein materials of the first active layer and the second active layer comprises semiconductor-type carbon nanotubes, the first barrier layer is an electrophilic film layer, and the second barrier layer is an electron donor film layer.

In an embodiment of the present invention, the substrate is a heavily doped silicon wafer.

In an embodiment of the present invention, the substrate comprises a flexible substrate, a buffer layer disposed on the flexible substrate, and a first gate and a second gate arranged at an interval on the buffer layer; wherein the first active layer and the second active layer are respectively disposed corresponding to the first gate and the second gate.

In an embodiment of the present invention, the substrate comprises a glass substrate and a first gate and a second gate arranged at an interval on the glass substrate; wherein the first active layer and the second active layer are respectively disposed corresponding to the first gate and the second gate.

In an embodiment of the present invention, material of the first barrier layer comprises silicon nitride, and material of the second barrier layer comprises silicon oxide.

An embodiment of the present invention further provides an inverter, comprising: a substrate, a first insulating layer disposed on the substrate, a first active layer and a second active layer spaced apart from each other on the first insulating layer, a first barrier layer disposed on the first active layer, a second barrier layer disposed on the second active layer, a first source and a first drain which are in contact with and spaced from two ends of the first active layer, and a second source and a second drain which are in contact with and spaced from two ends of the second active layer, wherein the first drain is connected to the second source; wherein materials of the first active layer and the second active layer comprises semiconductor-type carbon nanotubes, the first barrier layer is an electrophilic film layer, and the second barrier layer is an electron donor film layer; wherein material of the first barrier layer comprises silicon nitride, and material of the second barrier layer comprises silicon oxide; and wherein the first barrier layer and the first active layer form an N-type device, and the second barrier layer and the second active layer form a P-type device.

Beneficial effects of the present application are that: an embodiment of the present invention provides a method of manufacturing an inverter comprising following steps: a step S1, forming a substrate and forming a first insulating layer on the substrate; a step S2, forming a semiconductor-type carbon nanotube film on the first insulating layer; a step S3, patterning the semiconductor-type carbon nanotube film to form a first active layer and a second active layer arranged at an interval; a step S4, forming a first barrier layer on the first active layer and forming a second barrier layer on the second active layer, wherein the first barrier layer is an electrophilic film layer, and the second barrier layer is an electron donor film layer; and a step S5, forming a first source and a first drain which are in contact with and spaced apart from two ends of the first active layer and forming a second source and a second drain which are in contact with and spaced with two ends of the second active layer, wherein the first drain is connected to the second source. By using the semiconductor-type carbon nanotube as the active layer to cooperate with the electrophilic film layer and the electron donor film layer as a barrier layer, manufacturing process of the inverter can be simplified, and manufacturing cost of the inverter can be reduced. An embodiment of the present invention is also to provide an inverter, which can simplify manufacturing process of the inverter and reduce manufacturing cost of the inverter.

DESCRIPTION OF DRAWINGS

In order to further understand the features and technical contents of the present invention, please refer to the following detailed description and accompanying drawings of the present invention. However, the drawings are only provided for reference and description, and are not intended to limit the present invention.

In the drawings.

DETAILED DESCRIPTION OF PREFERRED EMBODIMENTS

In order to further explain the technical means adopted by the present invention and its effects, the following describes in detail with reference to the preferred embodiments of the present invention and the accompanying drawings.

Figure 16:
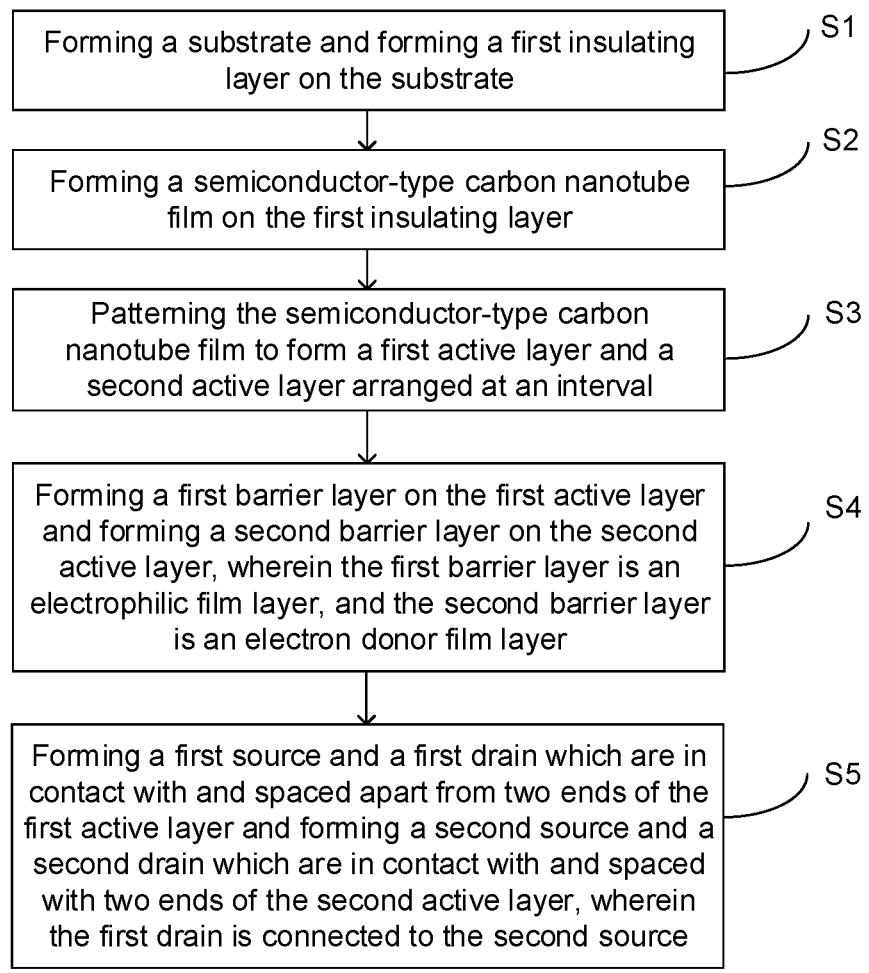
FIG. 16 is a flowchart of a method of manufacturing an inverter according to the present invention.

Referring to FIG. 16, an embodiment of the present invention provides a method of manufacturing an inverter, including the following steps.

Step S1, forming a substrate 1 and forming a first insulating layer 2 on the substrate 1.

Figure 1:
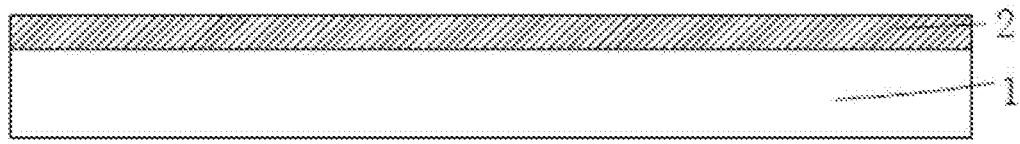
FIG. 1 is a schematic diagram of a step S1 of a first embodiment of a method of manufacturing an inverter according to the present invention.

Specifically, as shown in FIG. 1, in a first embodiment of the present invention, the substrate 1 is a heavily doped silicon wafer.

Figure 6:
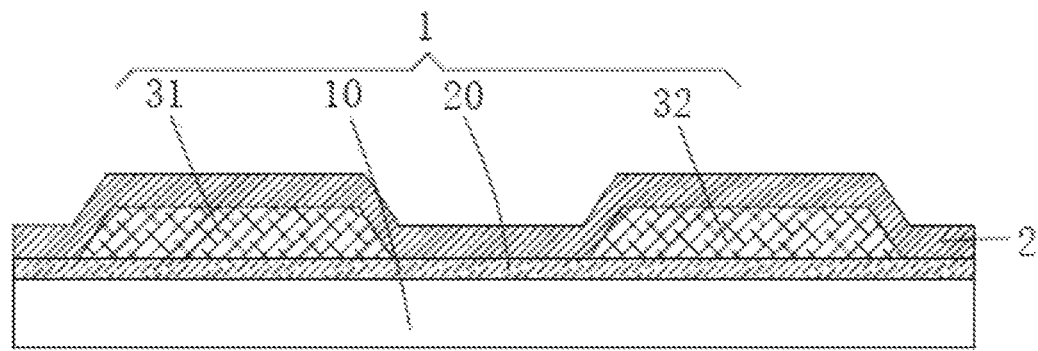
FIG. 6 is a schematic diagram of a step S1 of a second embodiment of a method of manufacturing an inverter according to the present invention.

Specifically, as shown in FIG. 6, in a second embodiment of the present invention, a step of forming the substrate 1 in the step S1 includes: providing a flexible substrate 10, covering the flexible substrate 10 with a buffer layer 20, forming a first gate 31 and a second gate 32 arranged at an interval on the buffer layer to obtain the substrate 1.

Figure 10:
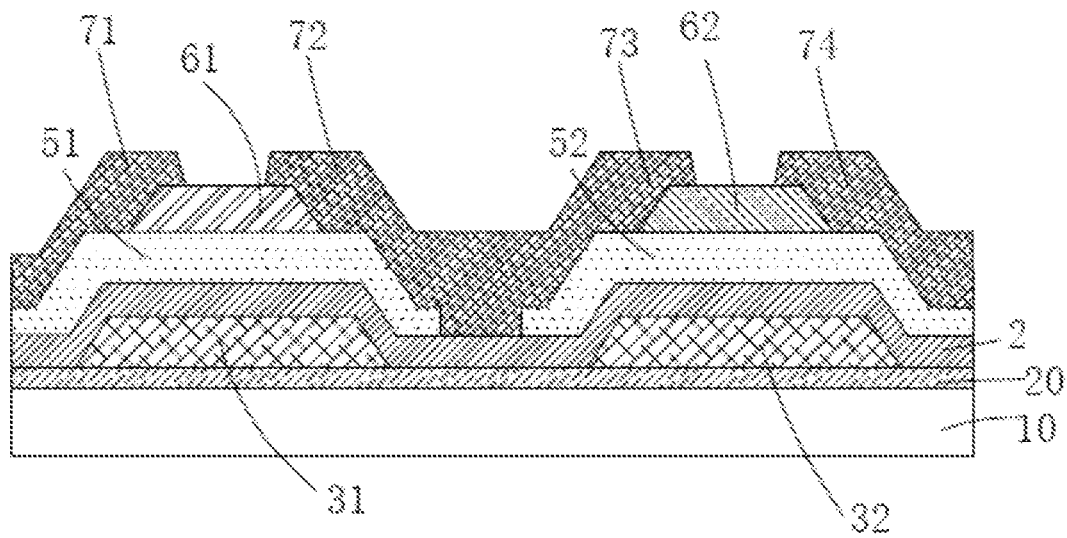
FIG. 10 is a schematic diagram of a step S5 of the second embodiment of the method of manufacturing the inverter according to the present invention and a structural diagram of the second embodiment of the inverter according to the present invention.
Figure 11:
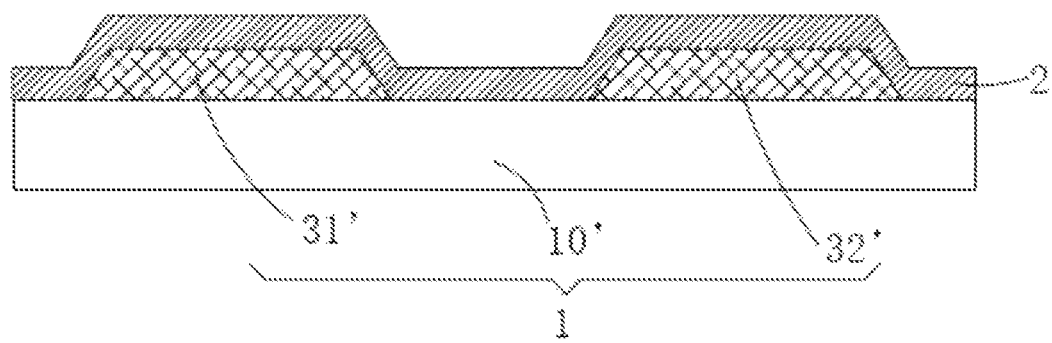
FIG. 11 is a schematic diagram of a step S1 of a third embodiment of a method of manufacturing an inverter according to the present invention.

Specifically, as shown in FIG. 10, in a third embodiment of the present invention, a step of forming the substrate 1 in the step S1 includes: providing a glass substrate 10' and forming a first gate 31' and a second gate 32' arranged at an interval on the glass substrate 10' to obtain the substrate 1.

Therefore, the manufacturing method of the inverter of the embodiment of the present invention is applicable to both silicon wafer substrate, flexible substrate, and glass substrate devices.

Specifically, in the second and third embodiments of the present invention, the process of forming the first gate and the second gate includes: cleaning the substrate 1 and depositing a conductive film on an entire surface of the substrate by physical vapor deposition or evaporation, then applying a photoresist, then exposing a photoresist through a photomask, and then developing, acid wet etching, and eluting to complete photolithography of a conductive film to obtain the first gate and the second gate.

Specifically, in an embodiment of the present invention, the first insulating layer 2 is manufactured by atomic layer deposition or chemical vapor deposition.

Specifically, material of the first insulating layer 2 is a combination of one or more of hafnium dioxide, silicon oxide, silicon nitride, and aluminum oxide.

Preferably, in the first embodiment of the present invention, the material of the first insulating layer 2 is silicon oxide. In the second and third embodiments of the present invention, the material of the first insulating layer 2 is nitrogen silicon.

Step S2, forming a semiconductor-type carbon nanotube film on the first insulating layer 2.

Specifically, in the step S2, the semiconductor-type carbon nanotube film is manufactured by a solution printing and film-forming process, and the semiconductor-type carbon nanotube film is a semiconductor-type single-walled carbon nanotube (sc-SWCNT).

It should be noted that production of the semiconductor-type carbon nanotube film by the solution printing and film-forming process has advantages of being simple and easy, requiring no vacuum, high temperature, and high pressure environment and conditions, being easy to prepare in a large area, having a rich source of carbon elements, having stable chemical properties, being non-toxic, and being conducive to building green and cheap devices. By using a bipolar semiconductor-type carbon nanotube as an active layer, the inverter has advantages of simple structure, low power consumption, and high stability.

Step S3, patterning the semiconductor-type carbon nanotube film to form a first active layer 51 and a second active layer 52 arranged at an interval.

Figure 2:
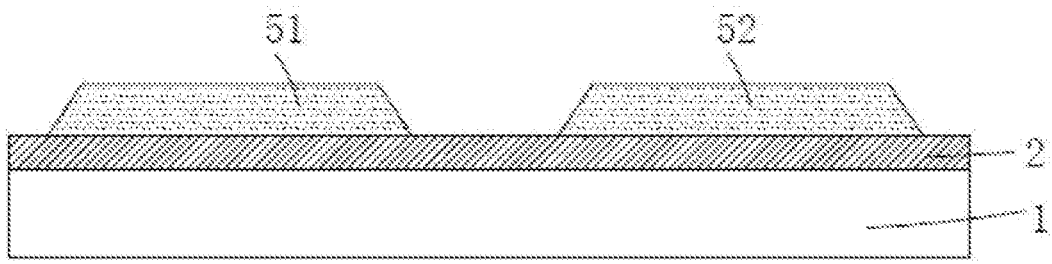
FIG. 2 is a schematic diagram of steps S2 and S3 of the first embodiment of the method of manufacturing the inverter according to the present invention.
Figure 3:
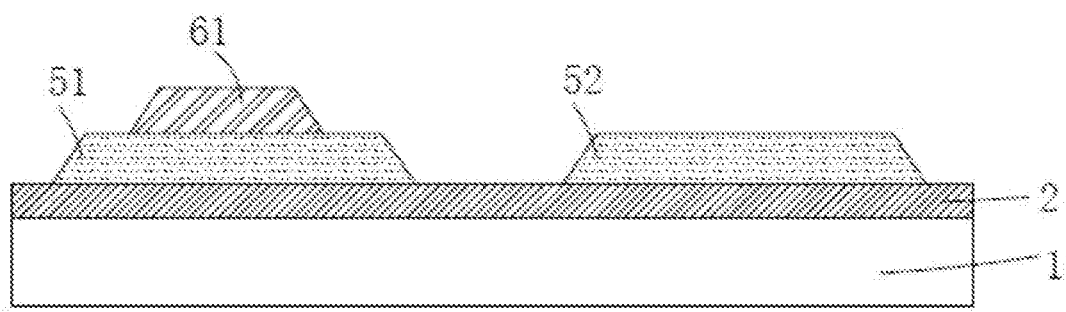
FIG. 3 and FIG. 4 are schematic diagrams of a step S4 of the first embodiment of the method of manufacturing the inverter according to the present invention.
Figure 4:
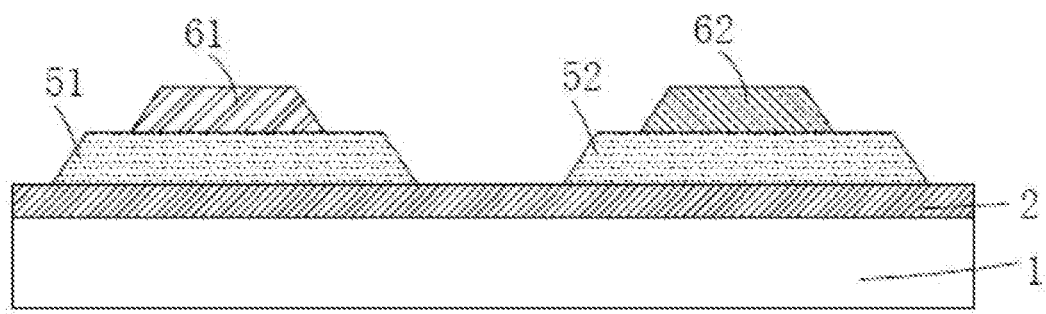
Figure 7:
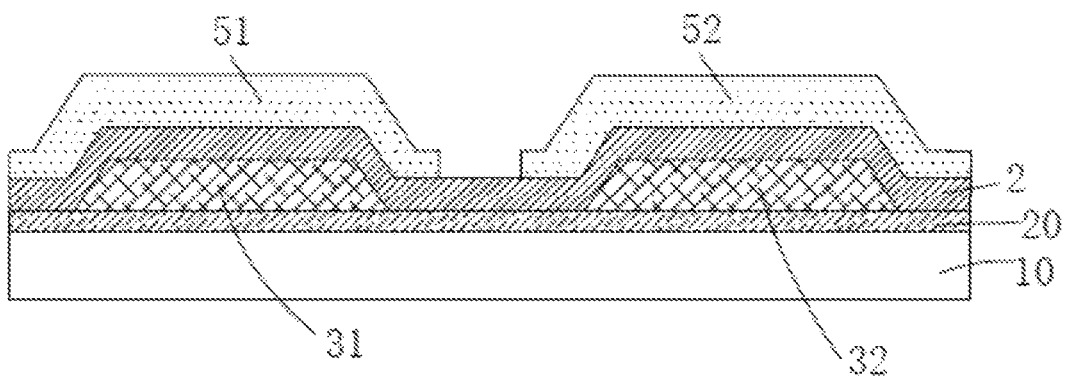
FIG. 7 is a schematic diagram of steps S2 and S3 of the second embodiment of the method of manufacturing the inverter according to the present invention.
Figure 8:
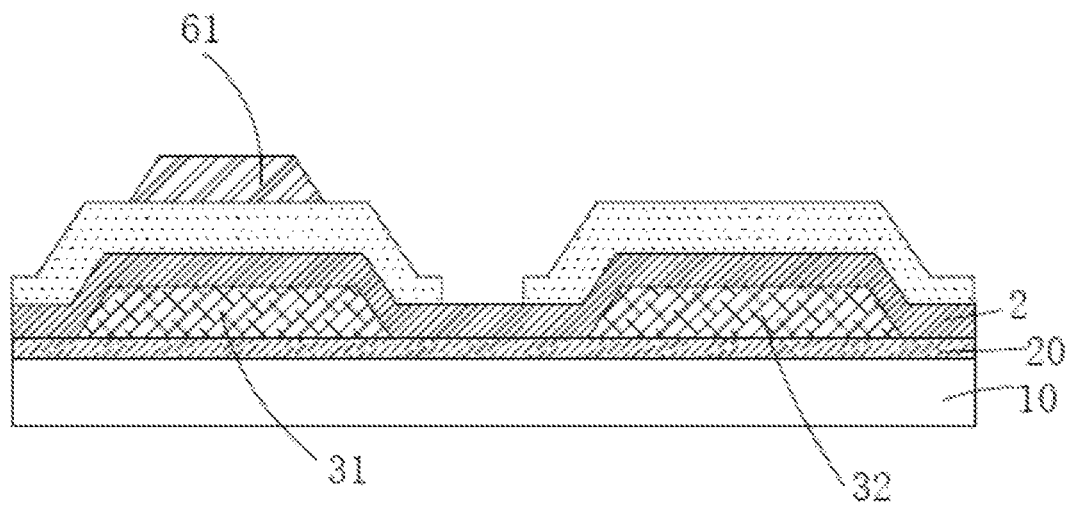
FIG. 8 and FIG. 9 are schematic diagrams of a step S4 of the second embodiment of the method of manufacturing the inverter according to the present invention.
Figure 9:
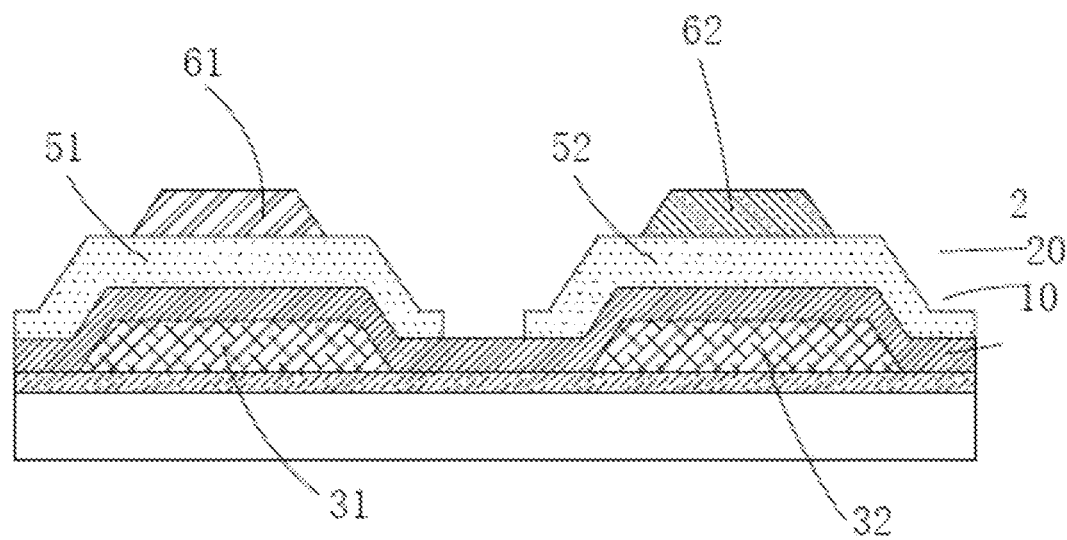
Figure 12:
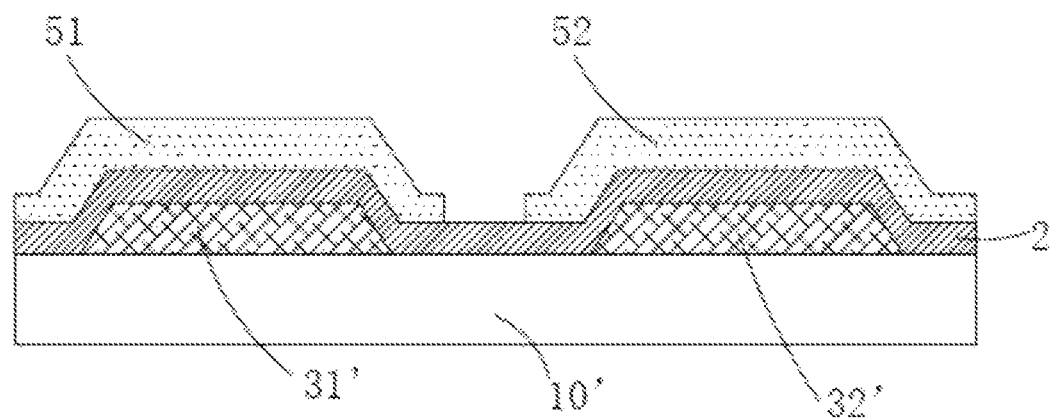
FIG. 12 is a schematic diagram of steps S2 and S3 of the third embodiment of the method of manufacturing the inverter according to the present invention.
Figure 13:
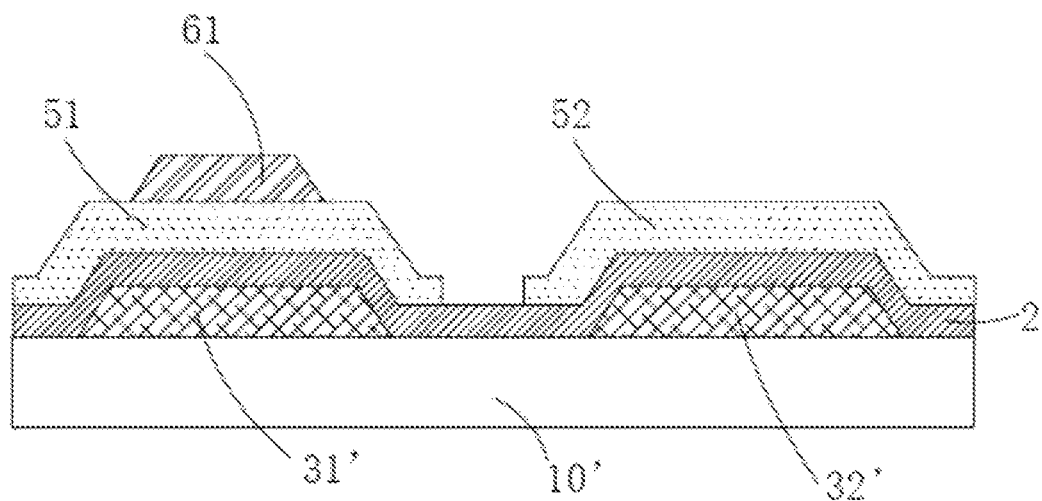
FIG. 13 and FIG. 14 are schematic diagrams of a step S4 of the third embodiment of the method of manufacturing the inverter according to the present invention.
Figure 14:
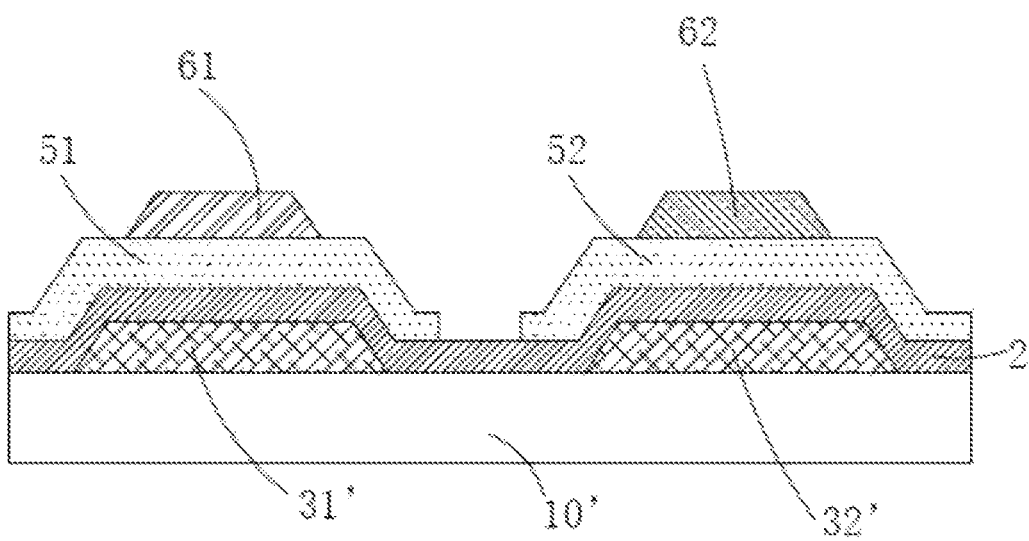

Specifically, referring to FIG. 2, FIG. 7, and FIG. 12, the step S3 includes: patterning the semiconductor-type carbon nanotube film by applying photoresist, photomask exposure, development, and plasma dry etching processes to obtain the first active layer 51 and the second active layer 52.

Specifically, as shown in FIG. 7, in a second embodiment of the present invention, the first active layer 51 and the second active layer 52 are respectively disposed corresponding to the first gate 31 and the second gate 32.

Specifically, as shown in FIG. 12, in a third embodiment of the present invention, the first active layer 51 and the second active layer 52 are respectively disposed corresponding to the first gate 31' and the second gate 32'.

Step S4, forming a first barrier layer 61 on the first active layer 51 and forming a second barrier layer 62 on the second active layer 52, wherein the first barrier layer 61 is an electrophilic film layer, and the second barrier layer 62 is an electron donor film layer.

Specifically, as shown in FIG. 3 and FIG. 4, FIG. 8 and FIG. 9, and FIG. 13 and FIG. 14, the step S4 includes: step of forming a first photoresist layer on the first insulating layer 2, the first active layer 51, and the second active layer 52.

Step of removing the first photoresist layer on the first active layer 51, forming a first barrier film on the remaining first photoresist layer and the first active layer 51, removing the remaining first photoresist layer and the first barrier film on the remaining first photoresist layer to obtain a first barrier layer 61 on the first active layer 51.

Step of forming a second photoresist layer on the first insulating layer 4, the first barrier layer 61, and the second active layer 52.

Step of removing the second photoresist layer on the second active layer 52, forming a second barrier film on the remaining second photoresist layer and the second active layer 52, removing the remaining second photoresist layer and the second barrier film on the remaining second photoresist layer to obtain a second barrier layer 62 on the second active layer 52.

Preferably, material of the first barrier layer 61 comprises silicon nitride, and material of the second barrier layer 62 comprises silicon oxide.

Further, the first barrier layer 61 and the first active layer 51 form an N-type device, and the second barrier layer 62 and the second active layer 52 form a P-type device, thereby achieving bipolar characteristics of the inverter.

Step S5, forming a first source 71 and a first drain 72 which are in contact with and spaced apart from two ends of the first active layer 51 and forming a second source 73 and a second drain 74 which are in contact with and spaced with two ends of the second active layer 52, wherein the first drain 72 is connected to the second source 73.

Figure 5:
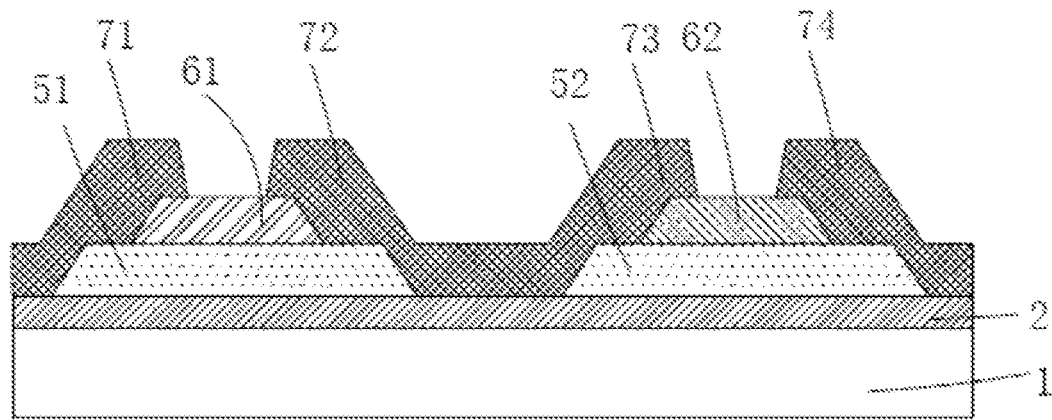
FIG. 5 is a schematic diagram of a step S5 of the first embodiment of the method of manufacturing the inverter according to the present invention and a structural diagram of the first embodiment according to the inverter of the present invention.
Figure 15:
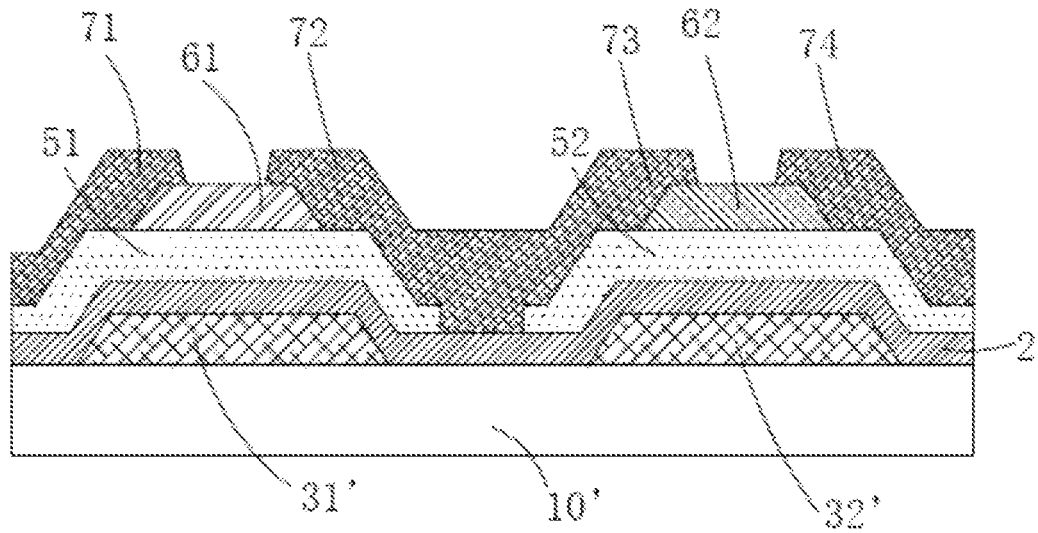
FIG. 15 is a schematic diagram of a step S5 of the third embodiment of the method of manufacturing the inverter according to the present invention and a structural diagram of the third embodiment of the inverter according to the present invention.

Specifically, as shown in FIG. 5, FIG. 10, and FIG. 15, in the step S5, a whole surface of a conductive film is deposited on the substrate by physical vapor deposition or evaporation, followed by coating photoresist, exposing, developing, wet etching with acid, and eluting photoresist to complete patterning of a conductive film to obtain a first source 71, a first drain 72, a second source 73, and a second drain 74.

Referring to FIG. 5, FIG. 10, or FIG. 15, an embodiment of the present invention also provides an inverter, comprising a substrate 1, a first insulating layer 2 disposed on the substrate 1, a first active layer 51 and a second active layer 52 spaced apart from each other on the first insulating layer 2, a first barrier layer 61 disposed on the first active layer 51, a second barrier layer 62 disposed on the second active layer 52, a first source 71 and a first drain 72 which are in contact with and spaced from two ends of the first active layer 51, and a second source 73 and a second drain 74 which are in contact with and spaced from two ends of the second active layer 52, wherein the first drain 72 is connected to the second source 73.

Materials of the first active layer 51 and the second active layer 52 comprises semiconductor-type carbon nanotubes, the first barrier layer 61 is an electrophilic film layer, and the second barrier layer 62 is an electron donor film layer.

Specifically, as shown in FIG. 5, in a first embodiment of the present invention, the substrate 1 is a heavily doped silicon wafer.

Specifically, as shown in FIG. 10, in a second embodiment of the present invention, the substrate 1 comprises a flexible substrate 10, a buffer layer 20 disposed on the flexible substrate 10, and a first gate 31 and a second gate 32 arranged at an interval on the buffer layer 20.

The first active layer 51 and the second active layer 52 are respectively disposed corresponding to the first gate 31 and the second gate 32.

Specifically, as shown in FIG. 10, in a third embodiment of the present invention, the substrate 1 comprises a glass substrate 10' and a first gate 31' and a second gate 32' arranged at an interval on the glass substrate 10'.

The first active layer 51 and the second active layer 52 are respectively disposed corresponding to the first gate 31' and the second gate 32'.

Therefore, the manufacturing method of the inverter of the embodiment of the present invention is applicable to both silicon wafer substrate, flexible substrate, and glass substrate devices.

Preferably, material of the first barrier layer 61 comprises silicon nitride, and material of the second barrier layer 62 comprises silicon oxide.

Further, the first barrier layer 61 and the first active layer 51 form an N-type device, and the second barrier layer 62 and the second active layer 52 form a P-type device, thereby achieving bipolar characteristics of the inverter.

Specifically, in the step S2, the first active layer 51 and the second active layer 52 are manufactured by a solution printing and film-forming process, and the semiconductor-type carbon nanotube film is a semiconductor-type single-walled carbon nanotube (sc-SWONT).

It should be noted that production of the semiconductor-type carbon nanotube film by the solution printing and film-forming process has advantages of being simple and easy, requiring no vacuum, high temperature, and high pressure environment and conditions, being easy to prepare in a large area, having a rich source of carbon elements, having stable chemical properties, being non-toxic, and being conducive to building green and cheap devices. By using a bipolar semiconductor-type carbon nanotube as an active layer, the inverter has advantages of simple structure, low power consumption, and high stability.

In summary, an embodiment of the present invention provides a method of manufacturing an inverter comprising following steps: a step S1, forming a substrate and forming a first insulating layer on the substrate; a step S2, forming a semiconductor-type carbon nanotube film on the first insulating layer; a step S3, patterning the semiconductor-type carbon nanotube film to form a first active layer and a second active layer arranged at an interval; a step S4, forming a first barrier layer on the first active layer and forming a second barrier layer on the second active layer, wherein the first barrier layer is an electrophilic film layer, and the second barrier layer is an electron donor film layer; and a step S5, forming a first source and a first drain which are in contact with and spaced apart from two ends of the first active layer and forming a second source and a second drain which are in contact with and spaced with two ends of the second active layer, wherein the first drain is connected to the second source. By using the semiconductor-type carbon nanotube as the active layer to cooperate with the electrophilic film layer and the electron donor film layer as a barrier layer, manufacturing process of the inverter can be simplified, and manufacturing cost of the inverter can be reduced. An embodiment of the present invention is also to provide an inverter, which can simplify manufacturing process of the inverter and reduce manufacturing cost of the inverter.

What is claimed is:

1. An inverter, comprising:
    a substrate, a first insulating layer disposed on the substrate, a first active layer and a second active layer spaced apart from each other on the first insulating layer, a first barrier layer disposed on the first active layer, a second barrier layer disposed on the second active layer, a first source and a first drain which are in contact with and spaced from two ends of the first active layer, and a second source and a second drain which are in contact with and spaced from two ends of the second active layer, wherein the first drain is connected to the second source;
    wherein materials of the first active layer and the second active layer comprises semiconductor-type carbon nanotubes, the first barrier layer is an electrophilic film layer, and the second barrier layer is an electron donor film layer.

2. The inverter according to claim 1, wherein the substrate is a heavily doped silicon wafer.

3. The inverter according to claim 1, wherein the substrate comprises a flexible substrate, a buffer layer disposed on the flexible substrate, and a first gate and a second gate arranged at an interval on the buffer layer; wherein the first active layer and the second active layer are respectively disposed corresponding to the first gate and the second gate.

4. The inverter according to claim 1, wherein the substrate comprises a glass substrate and a first gate and a second gate arranged at an interval on the glass substrate; wherein the first active layer and the second active layer are respectively disposed corresponding to the first gate and the second gate.

5. The inverter according to claim 1, wherein material of the first barrier layer comprises silicon nitride, and material of the second barrier layer comprises silicon oxide.

6. An inverter, comprising:
    a substrate, a first insulating layer disposed on the substrate, a first active layer and a second active layer spaced apart from each other on the first insulating layer, a first barrier layer disposed on the first active layer, a second barrier layer disposed on the second active layer, a first source and a first drain which are in contact with and spaced from two ends of the first active layer, and a second source and a second drain which are in contact with and spaced from two ends of the second active layer, wherein the first drain is connected to the second source;
    wherein materials of the first active layer and the second active layer comprises semiconductor-type carbon nanotubes, the first barrier layer is an electrophilic film layer, and the second barrier layer is an electron donor film layer;
    wherein material of the first barrier layer comprises silicon nitride, and material of the second barrier layer comprises silicon oxide; and
    wherein the first barrier layer and the first active layer form an N-type device, and the second barrier layer and the second active layer form a P-type device.

* * * * *